COMPOSITE HETEROEPITAXIAL STRUCTURE

Filed Sept. 20, 1966 2 Sheets-Sheet 1

INVENTORS
GUIDO GALLI
FRED L. MORRITZ
CARL A. WILEY
Howard A. Silber
ATTORNEY

COMPOSITE HETEROEPITAXIAL STRUCTURE
Filed Sept. 20, 1966 2 Sheets-Sheet 2
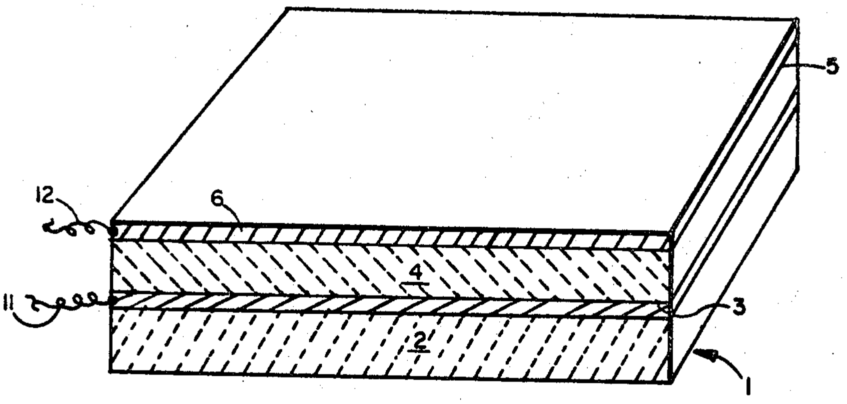
FIG. 4
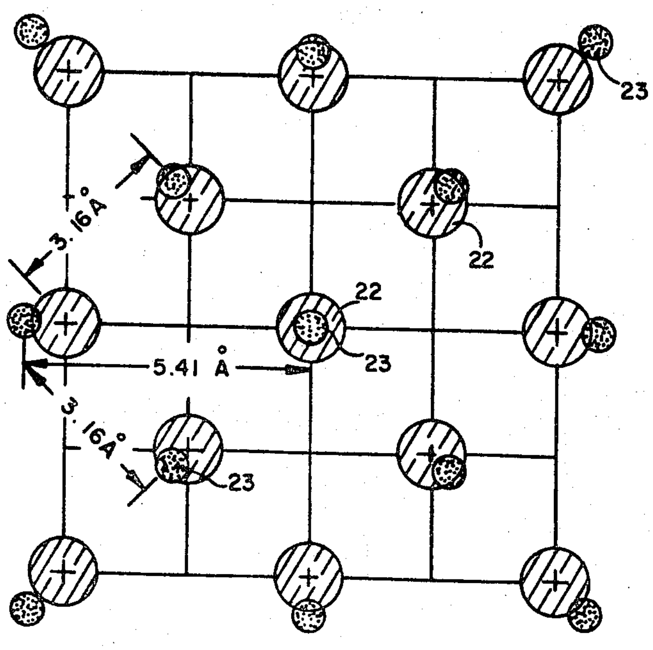
FIG. 3
*INVENTORS*
GUIDO GALLI
FRED L. MORRITZ
CARL A. WILEY
Howard Silber
ATTORNEY United States Patent Office 3,417,301
Patented Dec. 17, 1968

3,417,301
COMPOSITE HETEROEPITAXIAL STRUCTURE
Guido Galli, Orange, Fred L. Morritz, Fullerton, and Carl A. Wiley, Corona Del Mar, Calif., assignors to North American Rockwell Corporation
Filed Sept. 20, 1966, Ser. No. 580,818
10 Claims. (Cl. 317—237)

ABSTRACT OF THE DISCLOSURE

A composite heteroepitaxial structure comprises a single crystal constituted of an electrically insulating substrate, a metal layer epitaxially disposed on the substrate and a layer of semiconductor material epitaxially disposed on the metal layer.

This invention relates to a multiple layer, thin film heteroepitaxial structure, and more particularly, to a composite including a single crystal, electrically insulating substrate, a monocrystalline layer of metal epitaxially grown on the substrate, and an epitaxial layer of semiconductor material on the metal layer.

The composites of this invention are useful in applications requiring semiconductor materials exhibiting electro-optic or piezoelectric effects. The composites are particularly valuable since an electrical contact having good optical reflectivity is included as an element of the structure. Further, since the composite semiconductor layer is a thin film, piezoelectric effects can be achieved at frequencies significantly higher than obtainable using conventionally prepared piezoelectric crystals. In addition, since the structure utilizes an electrically insulating substrate, multiple electrically isolated piezoelectric or electro-optic devices may be produced on a single substrate.

In the past, difficulty has been experienced in preparing large single crystals of chalcogenides of zinc (Zn) or cadmium (Cd). In the case of ZnS, a mixture of the würzite (hexagonal) and sphalerite (cubic) crystalline forms was obtained, rather than a pure crystal of one form. Moreover, attempts at growing single crystal chalcogenides of Zn or Cd directly on single crystal materials such as sapphire have resulted in structure having many defects, as disclosed by X-ray crystallographic studies. In either case, the chalcogenide would be unacceptable for use as an electro-optic or piezoelectric effect device, which devices preferably require single crystal materials with few defects.

The multiplier epitaxial structure which is the subject of the invention described herein comprises a substrate of single crystal, electrically insulating material, an intermediate monocrystalline layer of metal epitaxially grown on the substrate, and a semiconductor layer including a chalcognide of zinc or cadmium epitaxially grown on the metal layer.

It is therefore an object of this invention to provide a multilayer heteroepitaxial structure.

It is another object of this invention to provide a structure in which a thin film of a semiconductor is grown epitaxially on a thin film of monocrystalline metal which itself is grown epitaxially on a single crystal, electrically insulating substrate.

It is yet another object of this invention to provide a structure including a single crystal chalcogenide of zinc or cadmium which can be used for piezoelectric or electro-optic effect devices.

It is a further object of this invention to provide a structure including a chalcogenide of zinc or cadmium, together with an optically reflective, metallic electrical conductor integrally joining the chalcogenide and the single crystal, electrically insulating substrate.

Further objects and features of the invention will become apparent from the following description and drawings which are utilized for illustrative purposes only.

FIG. 3 is a diagram of the lattice sites at the interface between the metal layer and the semiconductor layer of the composite of FIG. 1;

FIG. 4 shows another embodiment of the multilayer heteroepitaxial structure.

Figure 1:
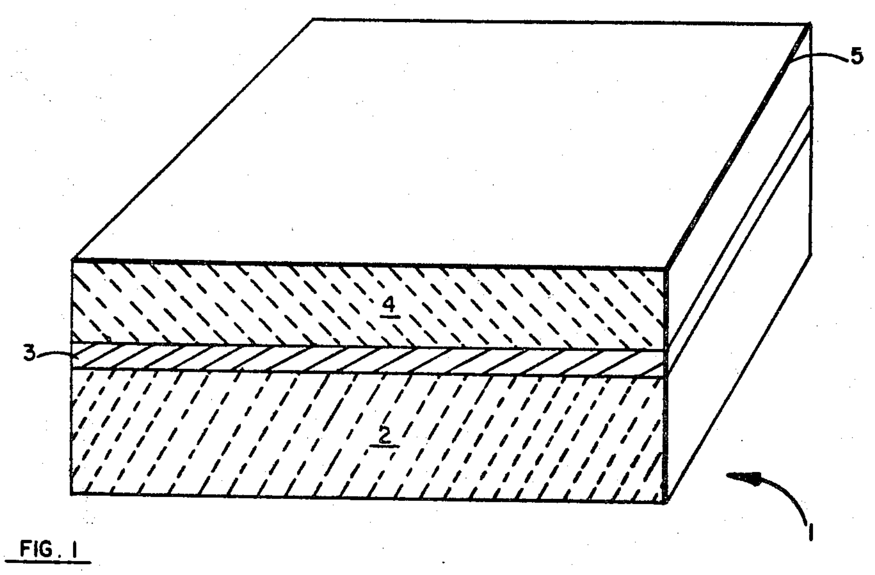
FIG. 1 shows a greatly enlarged perspective view, in partial section and in partial elevation, of the multilayer structure which is the subject of this invention.

Referring to FIG. 1, it may be seen that the composite heteroepitaxial structure 1 comprises a substrate 2 of single crystal, electrically insulating material. Substrate 2 preferably is of alpha-corundum (sapphire, $Al_2O_3$) however other monocrystalline materials such as BeO, MgO, and spinel ($MgO \cdot Al_2O_3$) also are satisfactory. Each of these is a metal oxide with either a cubic or hexagonal crystalline structure. The substrate should be cut such that the face on which metal layer 3 is to be prepared is parallel to one of the crystallographic planes of the substrate. For exmaple, should sapphire be used, the substrate may be cut parallel to either the $1\bar{1}02$ or $11\bar{2}6$ crystallographic planes.

Referring again to FIG. 1, on the substrate 2, there is grown epitaxially a metal layer 3 of monocrystalline material. This metal preferably is tungsten (lattice parameter 3.1647), however other metals having a body centered cubic crystalline structure, and a lattice parameter between approximately 3.02 A. and 3.31 A. may be used. For example, the following metals (listed with their lattice parameters in parenthesis) are applicable: molybdenum (3.1473 A.), vanadium (3.0240 A.), tantalum (3.3058 A.), and columbium (3.3004 A.). This range of lattice parameters is desirable because it is within 15% of the lattice dimensions of the substrate material.

While metal layer 3 is illustrated in FIG. 1 as being disposed over the entire surface of substrate 2, it will be understood that this is not required, and that metal layer 3 need only be disposed over a portion of the surface of substrate 2. Moreover, it may be desirable to have a metal layer 3 disposed over several isolated areas of the surface of substrate 2, e.g., to produce a number of electrically isolated devices on a common substrate.

Vapor phase transport over a temperature gradient or other techniques equally well known to those skilled in the art may be used for epitaxially growing metal layer 3. For example, the substrate 2 may be placed in a evacuated chamber and heated to an elevated temperature below the melting point of the metal used. Metal in the vapor phase then is introduced into the chamber, perhaps mixed with an inert carrier gas; the metal will deposit onto the substrate surface, and grow into a single crystal layer whose crystalline orientation is determined by the orientation of the exposed substrate surface. A description of a technique for growing tungsten epitaxially on sapphire, using proplytic decomposition of $WF_6$ as the tungsten source, can be found in the article entitled "Orientation Relationships in the Heteroepitaxial Tungsten-on-Sapphire System," by Arnold Miller, H. M. Manasevit, D. H. Forbes, and I. B. Cadoff published in the Journal of Applied Physics, volume 37, No. 7, pages 2921 to 2922, June 1966.

The metal layer 3 optimally is of a thickness between 500 A. and 1000 A., although thicker layers may be desired for some applications. This thickness is sufficient to insure a continuous monocrystalline film of the metal on the substrate surface, and also is sufficiently thick to provide a satisfactory electrical contact for the semiconductor layer 4, should such a contact be desired. In addition, the surface of metal layer 3, as grown, is highly reflective optically. No subsequent polishing of the metal layer is required, either to improve its optical reflectance characteristics, or to prepare it for subsequent epitaxial deposition of semiconductor layer 4.

Figure 2:
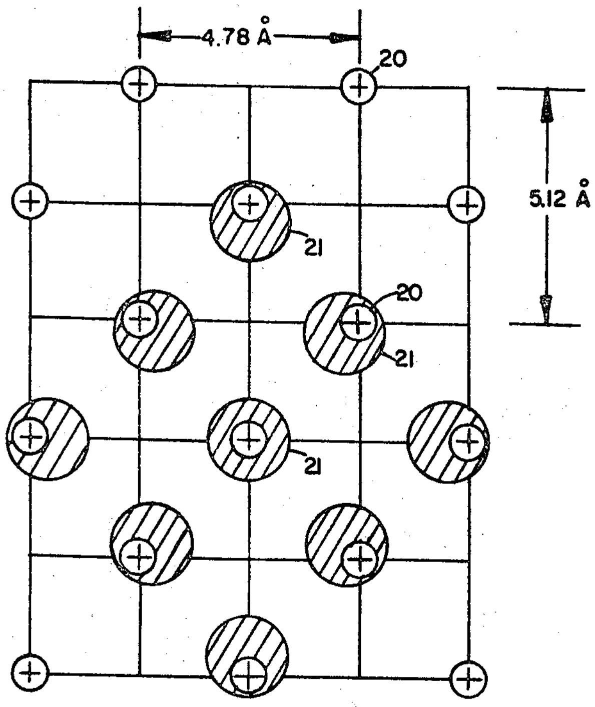
FIG. 2 is a diagram of the lattice sites at the interface between the substrate and the metal layer of the composite of FIG. 1.

When tungsten is grown on sapphire, the metal layer 3 has been found to grow with its 100 crystallographic plane at a small angle to the $1\bar{1}02$ plane of the substrate 2. With the $1\bar{1}02$ plane of the sapphire as a reference, the mating 100 plane of the tungsten assumes an angle of between 1° and 9°. FIG. 2 illustrates the lattice overlay for 100 tungsten on $1\bar{1}02$ sapphire; note the relative sites of the tungsten atoms 21 with respect to the aluminum ions 20 of the sapphire. Alternately, when the $11\bar{2}6$ crystallograph plane of sapphire is used as the substrate 2 growth surface, the tungsten metal layer 3 assumes the 311 orientation.

Semiconductor layer 4 (see FI.G 1) which may comprise a chalcogenide of zinc or cadmium, is grown epitaxially atop metal layer 3 using either thermal transport or chemical vapor transport techniques well known to those skilled in the art. As shown in FIG. 1, layer 4 covers the entire surface of metal layer 3; it will be understood that the invention is not so limited and that semiconductor layer 4 may be disposed over only a portion of metal layer 3, or over several isolated regions of the surface of metal layer 3.

Thermal transport deposition of semiconductor layer 4 may be achieved, e.g., by placing the substrate 2 and metal layer 3 combination in a chamber. The chalcogenide to be deposited (ZnS, CdSe, etc.) also is placed in the chamber, in solid form, and heated to slightly above its vaporization temperature (generally between 600° C. and 1000° C. depending on the specific chalcogenide used). Carrier gas such as argon or hydrogen is introduced into the chamber to carry the gaseous chalcogenide downstream to the substrate 2/metal layer 3 combination, which combination is heated to a temperature some 50° C. to 75° C. less than the temperature of the chalcogenide source. The chalcogenide deposits and grows epitaxially on metal layer 3.

As an example of the chemical vapor transport technique, deposition of semiconductor layer 4 may be achieved by placing the substrate 2 and metal layer 3 combination in a chamber, and heating the combination to approximately 50° C. to 75° C. below the vaporization temperature of the chalcogenide to be deposited. A halide of zinc or cadmium, and a chalcogen (e.g., sulfur), then are introduced into the chamber in gaseous form. The zinc or cadmium from the halide recombines with the chalcogen at the surface of metal layer 3 to form the desired chalcogenide, which in turn begins to deposit and grow epitaxially on layer 3.

Whether the thermal transport or chemical vapor transport technique is used, the chalcogenide generally assumes one form only, and not a combination of forms. For example, chalcogenidies of zinc most commonly assume a sphalerite type structure, and not a mixture of sphalerite and würzite forms. Moreover, the epitaxially deposited semiconductor layer 4 exhibits very few crystalline defects, as disclosed by X-ray Laue pattern studies.

When ZnS is deposited on the combination of a sapphire substrate 2 and a tungsten metal layer 3, the ZnS assumes an orientation which is related to the sapphire crystallographic plane used as the growth surface for the tungsten. For example, when the sapphire $1\bar{1}02$ plane is used, the tungsten assumes the 100 orientation, and the ZnS may grow with its 100 crystallographic face within 8° of parallelism with respect to the tungsten surface, or the ZnS may be oriented with its 111 plane within 8° of parallelism with respect to the W surface. FIG. 3 illustrates the lattice overlay for 100 ZnS on 100 tungsten; in this figure, the relative sites of the zinc ions 23 with respect to the tungsten atoms 22 are readily apparent. Alternately, when the $11\bar{2}6$ plane of sapphire is used, the tungsten assumes a 311 orientation, and the ZnS assumes a 116 orientation.

The semiconductor materials which may be utilized for layer 4 include chalcogenides of zinc and cadmium. The specific material selected would depend on the particular intended application.

Most of the chalcogenides of zinc and cadium exhibit electro-optic properties, and may be used, e.g., in Pockels effect devices. The Pockels effect (as described, for example, at pages 721 and 722, volume 2 of the book "Piezoelectricity," by Walter Guyton Cady and published by Dover Publications, Inc., 1964) involves a linear change in optical polarization constant of a crystalline material under the influence of an electric field. The effect is most evident in cubic crystals, which have a high degree of symmetry.

Should an electro-optic effect device for operation in the visible spectrum be desired, ZnS would be an appropriate material for layer 4. ZnS is colorless and exhibits a Pockels effect along its 100 crystalline plane. Since ZnS is cubic, such 100 planes are present normal and parallel to the interface of semiconductor layer 4 and metal layer 3 of structure 1, (e.g., when ZnS is deposited on 100 tungsten) as shown in FIG. 1. Since metal layer 3 is optically reflective, when light is directed at structure 1 through face 5, it may pass through semiconductor layer 4 along a 100 plane, be reflected by metal layer 3, again traverse layer 4 along a 100 plane, and exit via surface 5.

If the ZnS layer were subjected to an electric field normal to surface 5, the optical polarization constant of layer 4 would be affected, and this in turn could be used to modulate the light traversing semiconductor layer 4. Such an electric field could be implemented using the structure illustrated by FIG. 4.

The embodiment of the invention shown in FIG. 4 includes substrate 2, metal layer 3 and semiconductor layer 4, each identical to that described above in conjunction with FIG. 1. In addition, there is shown a transparent, electrically conductive layer 6 which may be vapor deposited on surface 5, but which need not be either crystalline or epitaxially grown. One suitable material for layer 6 is SnO. An electric field may be impressed across semiconductor layer 4 by applying an externally supplied voltage between electrical conductors 11 and 12, which conductors are connected respectively to metal layer 3 and conductive layer 6. Using the embodiment of FIG. 4, the optical properties of semiconductor layer 4 can be varied in response to changes in an externally supplied voltage.

Another means of applying an electric field across electro-optic layer 4 would be to place the structure of FIG. 1 in an evacuated chamber. Metal layer 3 could be used as a common electrode, while electrons are deposited onto surface 5 from an electron gun. The impinging electron stream could be focused and scanned across the surface 5 in some regular pattern, and could be modulated. The optical properties of the electro-optic material used for semiconductor layer 4 thus may be altered in local areas in response to the impinging electron stream. Electron pile-up on surface 5 is avoided by appropriate selection of the resistivity of layer 4 so as to allow the electrons to traverse layer 4 to common electrode 3.

The multilayer heteroepitaxial structure which is the subject of this invention also could be used as a piezoelectric device, by selecting an appropriate chalcogenide for semiconductor layer 4. ZnS, CdS, ZnSe, and CdSe, among others, exhibit useful piezoelectric effects, with ZnS being particularly effective. Again, metal layer 3 may be used as one electrode, while a second electrode 6 may be deposited on surface 5, as shown in FIG. 4. For use as a piezoelectric effect device, layer 6 (see FIG. 4) need not be transparent.

The most commonly used piezoelectric transducer material, quartz, is difficult to cut, lap, and polish to thicknesses less than about 0.001 inch. This dimension thus puts an upper limit on the frequency of oscillation of such quartz piezoelectric devices. Thin single crystal films of oriented ZnS can be produced to form layer 4 having thicknesses considerably less than 0.001 inch. For example, layer 4 may be as thin as 1 micron, thus allowing very high frequency piezoelectric operation.

Another application of the multilayer heteroepitaxial structure disclosed herein is as a sensitive photodetector. It is well known that CdS is a photosensitive material, even in a polycrystalline form. Should CdS be used for semiconductor layer 4, the fact that it is in single crystal form would result in greater sensitivity than for CdS in non-monocrystalline form.

Although the invention has been described and illustrated in detail, it is to be understood that the same is by way of illustration and example only and is not to be taken by way of limitation, the scope and spirit of this invention being limited only by the terms of the appended claims.

We claim:

1. In combination:

a single crystal, electrically insulating substrate;

a metal layer epitaxially disposed on said substrate; and a layer of semiconductor material epitaxially disposed on said metal layer.

2. The combination as defined by claim 1 wherein said substrate is selected from the class of materials consisting of sapphire, spinel, BeO and MgO.

3. The combination as defined by claim 1 wherein said metal is selected from the class consisting of tungsten, molybdenum, vanadium, tantalum and columbium.

4. The combination as defined by claim 1 wherein said semiconductor material comprises a chalcogenide of zinc or cadmium.

5. The combination as defined by claim 1 further including electrical conductor means disposed on said semiconductor layer.

6. The combination as defined by claim 1 wherein said metal has a lattice parameter within 15% of the lattice parameter of said substarate material, and wherein said semiconductor material is selected from the class consisting of ZnS, CdS, ZnSe, CdSe, ZnTe, and CdTe.

7. A three layer heteroepitaxial structure comprising a substrate of single crystal sapphire; an epitaxial layer of monocrystalline tungsten on said substrate, said tungsten layer having a thickness between 500 A. and 1000 A.; and a layer of single crystal ZnS epitaxially grown on said tungsten layer.

8. The structure as defined by claim 7 wherein the 100 plane of said tungsten is within 9° of parallelism with respect to the $1\bar{1}02$ plane of said sapphire, and wherein said 100 plane of said ZnS is within 8° of parallelism with respect to said 100 plane of tungsten.

9. The structure as defined by claim 7 wherein the 100 plane of said tungsten is within 9° of parallelism with respect to the $1\bar{1}02$ plane of said sapphire, and wherein said 111 plane of said ZnS is within 8° of parallelism with respect to said 100 plane of tungsten.

10. The structure as defined by claim 7 wherein said sapphire exhibits a $11\bar{2}6$ orientation, said tungsten exhibits a 311 orientation, and said ZnS exhibits a 116 orientation.

References Cited

UNITED STATES PATENTS

| | | | |
|---|---|---|---|
| 2,208,455 | 7/1940 | Glaser et al. | 317—237 |
| 3,142,594 | 7/1964 | Bahe | 317—235 X |
| 3,333,324 | 8/1967 | Roswell et al. | 317—235 X |

JAMES D. KALLAM, *Primary Examiner.*

U.S. Cl. X.R.

317—238, 234; 313—108